United States Patent
Kushitani et al.

(10) Patent No.: US 6,903,631 B2
(45) Date of Patent: Jun. 7, 2005

(54) SAW FILTER AND ELECTRONIC DEVICE INCLUDING SAW FILTER

(75) Inventors: Hiroshi Kushitani, Osaka (JP); Shunichi Seki, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/634,524

(22) Filed: Aug. 5, 2003

(65) Prior Publication Data

US 2004/0085161 A1 May 6, 2004

(30) Foreign Application Priority Data

Aug. 6, 2002 (JP) .................................. 2002-228868

(51) Int. Cl.[7] .............................. H03H 9/64; H03H 9/72
(52) U.S. Cl. .................... 333/193; 333/133; 333/195; 310/313 B
(58) Field of Search ............................ 333/193–196, 333/133; 310/313 B, 313 D

(56) References Cited

U.S. PATENT DOCUMENTS 5,905,418 A * 5/1999 Ehara et al. ............... 333/193
6,677,835 B2 * 1/2004 Noguchi et al. ........... 333/193
2003/0062969 A1 * 4/2003 Inoue ........................ 333/193

FOREIGN PATENT DOCUMENTS

| JP | 10-163808 | * | 6/1998 |
| JP | 2000-114923 | * | 4/2000 |
| JP | 2001-168672 | * | 6/2001 |
| JP | 2002-208835 | * | 7/2002 |
| JP | 2003-101384 | * | 4/2003 |
| JP | 2003-110404 | * | 4/2003 |

* cited by examiner

Primary Examiner—Barbara Summons
(74) Attorney, Agent, or Firm—RatnerPrestia

(57) ABSTRACT

A surface acoustic wave (SAW) filter includes an input terminal, an output terminal, a series resonator provided between the input terminal and the output terminal, first and second parallel resonators having respective one ports connected to respective ports of the series resonator, respectively, first and second nodes connected to respective other ports of the first and second parallel resonators, respectively, first and second inductance elements having respective one ends connected to the first and second nodes, respectively, a third node connected to respective other ends of the first and second inductance elements, a third inductance element having one end connected to the third node, a grounding terminal connected to other end of the third inductance element, and a capacitance element connected between the first and second nodes. The SAW filter has a large attenuation amount at a lower side of a pass band of the filter, thus having sufficient properties.

12 Claims, 7 Drawing Sheets

SAW FILTER AND ELECTRONIC DEVICE INCLUDING SAW FILTER

FIELD OF THE INVENTION

The present invention relates to a SAW filter and an electronic device including the SAW filter for use in a communications apparatus.

BACKGROUND OF THE INVENTION

In a conventional ladder-type surface acoustic wave (SAW) filter, as shown in FIG. 10, series resonators 3, 4, and 5 are connected in series between an input terminal 1 and an output terminal 2, and parallel resonators 6 and 7 are connected to respective ports of the series resonator 4. The parallel resonators 6 and 7 are connected to inductance elements 8 and 9, respectively. The inductance elements 8 and 9 are connected to one end of an inductance element 10. The other end of the inductance element 10 is connected to a grounding terminal 11.

A characteristic profile of the conventional ladder-type SAW filter having the above-described arrangement is shown by a line B in FIG. 4. As shown as the line B, the conventional SAW filter has a wide pass band and has a attenuation profile of an amplitude at both sides of the pass band.

The attenuation profile of the conventional SAW filter is not sufficient particularly at a lower side of the pass band. That is, as shown as the line B in FIG. 4, an attenuation amount tends to decline and then increase at the lower side of the pass band.

SUMMARY OF THE INVENTION

A surface acoustic wave (SAW) filter includes an input terminal, an output terminal, a series resonator provided between the input terminal and the output terminal, first and second parallel resonators having respective one ports connected to respective ports of the series resonator, respectively, first and second nodes connected to respective other ports of the first and second parallel resonators, respectively, first and second inductance elements having respective one ends connected to the first and second nodes, respectively, a third node connected to respective other ends of the first and second inductance elements, a third inductance element having one end connected to the third node, a grounding terminal connected to other end of the third inductance element, and a capacitance element connected between the first and second nodes.

The SAW filter has a large attenuation amount at a lower side of a pass band of the filter, thus having sufficient properties.

DETAILED DESCRIPTION OF THE PREFERRED EMBODIMENT

Figure 1:
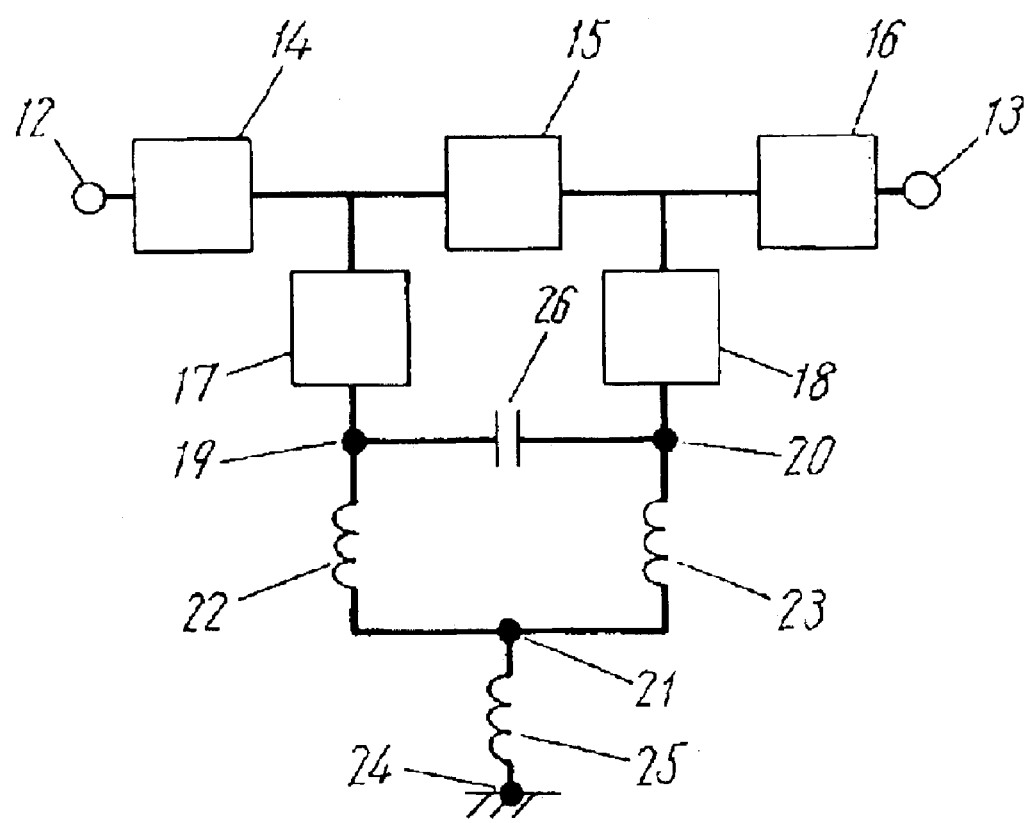
FIG. 1 is a circuit diagram of a SAW filter according to an exemplary embodiment of the present invention.

FIG. 1 illustrates a circuit diagram of a surface acoustic wave (SAW) filter according to an exemplary embodiment of the present invention. Series resonators 14, 15, and 16 are connected in series in this order between an input terminal 12 and an output terminal 13. Parallel resonators 17 and 18 have respective one ports connected to respective ports of the series resonator 15. The parallel resonators 17 and 18 have respective other ports connected to a first grounding node 19 and a second grounding node 20. A first inductance element 22 is connected between the first grounding node 19 and a third grounding node 21 while a second inductance element 23 is connected between the second grounding node 20 and the third grounding node 21. A third inductance element 25 is connected between the third grounding node 21 and a grounding terminal 24. A capacitance element 26 is connected between the first grounding node 19 and the second grounding node 20.

Figure 4:
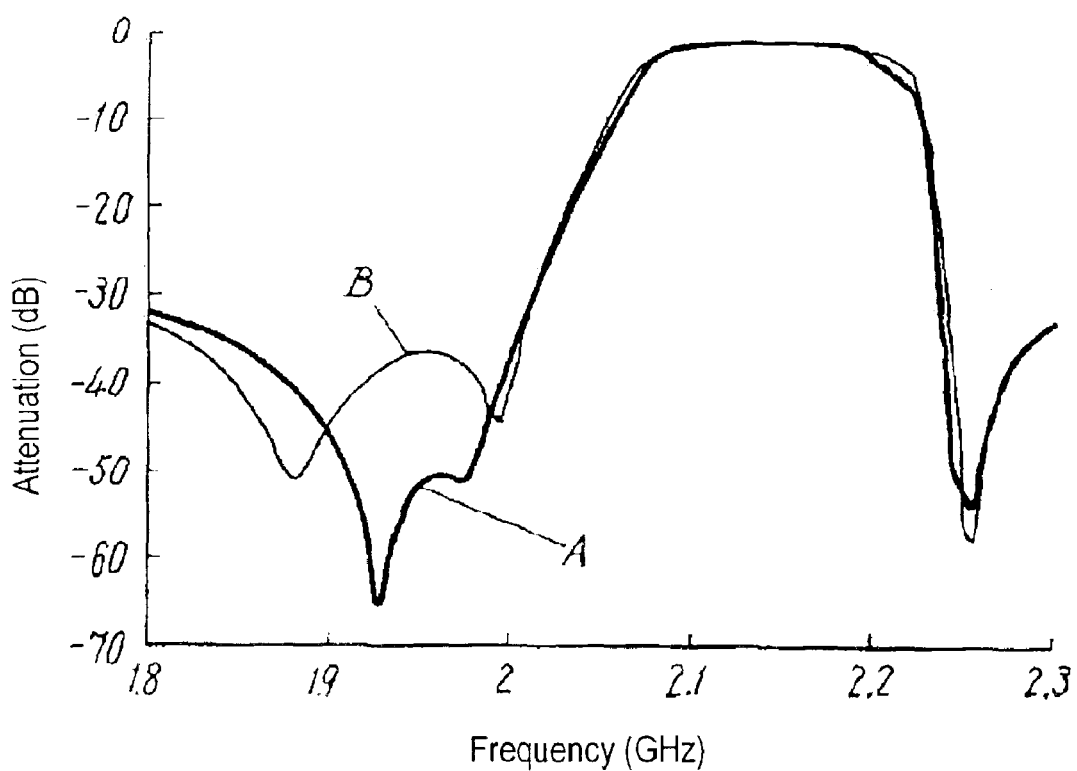
FIG. 4 is a frequency characteristic of the SAW filter of the embodiment.

A characteristic profile of the SAW filter is shown as a line A in FIG. 4. The SAW filter has a pass band ranging from 2.11 to 2.17 GHz with little loss and has a large attenuation at both sides of the pass band. As shown, the attenuation in the SAW filter is greater particularly at the lower side of the pass band than that in a conventional SAW filter denoted by the line B.

A reason will now be explained referring to FIGS. 3 and 5.

Figure 3:
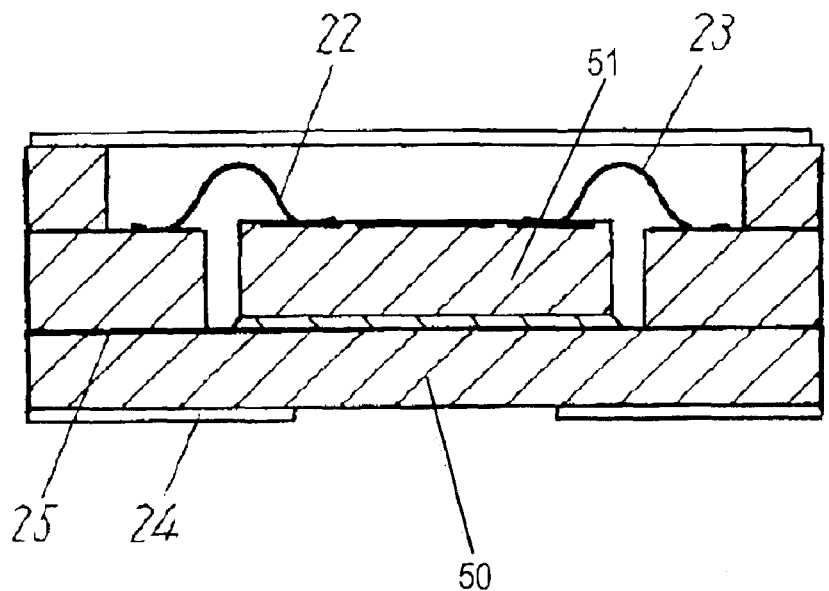
FIG. 3 is a cross sectional view of the SAW filter of the embodiment.

FIG. 3 is a cross sectional view of the SAW filter of the embodiment. The first inductance element 22 and the second inductance element 23 are formed of wires. The third inductance element 25 is provided as an electrode pattern formed on a package 50.

Figure 5:
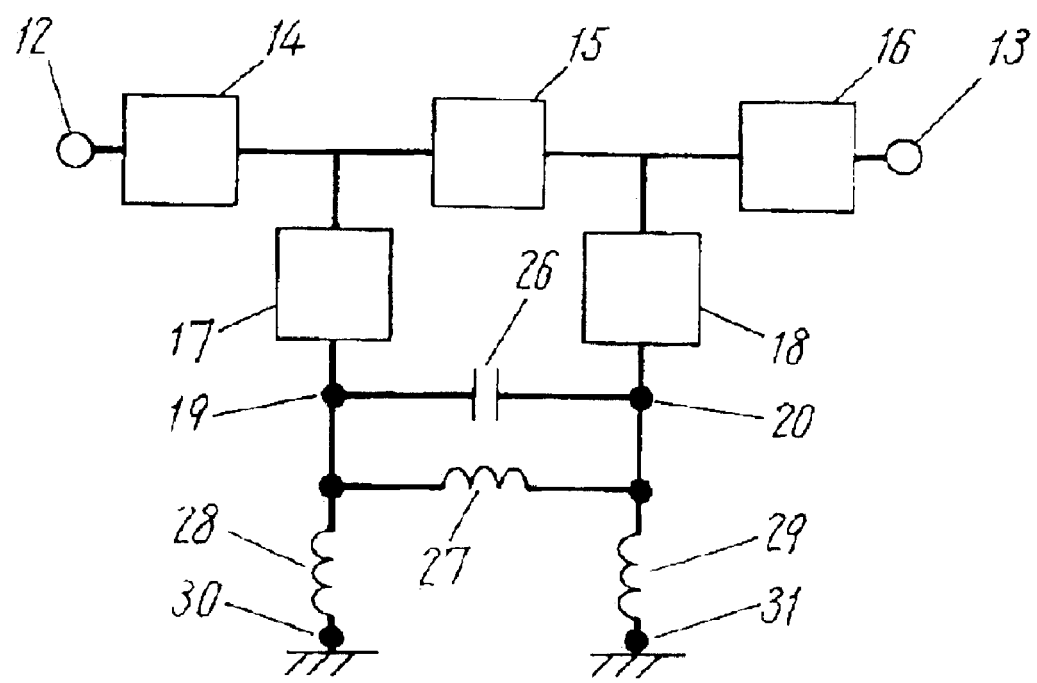
FIG. 5 is a circuit diagram electrically equivalent to that of the SAW filter of the embodiment.

FIG. 5 illustrates a circuit diagram equivalent to the circuit of the SAW filter of the embodiment.

The attenuation at the lower side of the pass band in the SAW filter depends a lot on the inductance elements 22, 23, and 25. Thus, the attenuation of the conventional SAW filter is adjusted by adjusting the inductances of the inductance elements. As shown in FIG. 3, the inductances are substantially defined by the shape of the package. Meanwhile, the conventional SAW filter has an attenuation first declining and then sprung up at the lower side of the pass band as shown in FIG. 4.

The inductance elements 22, 23, and 25 shown in FIG. 1 are arranged in a Y-shaped circuit in which the first grounding node 19, the second grounding node 20, and the grounding terminal 24 are coupled via the third grounding node 21 as a center of the circuit. The Y-shaped circuit is equivalently converted into a fourth inductance element 27 connected between the first grounding node 19 and the second grounding node 20, a fifth inductance element 28 connected between the first grounding node 19 and a grounding terminal 30, and a sixth inductance element 29 connected between the second grounding node 20 and a grounding terminal 31.

An inductance $L_1$ of the first inductance element 22, an inductance $L_2$ of the second inductance element 23, an inductance $L_3$ the third inductance element 25, an inductance $L_4$ of the fourth inductance element 27, an inductance $L_5$ of the fifth inductance element 28, and an inductance $L_6$ of the sixth inductance element 29 satisfy the following relation:

$$L_4 = (L_1L_2 + L_2L_3 + L_3L_1)/L_3;$$

$$L_5 = (L_1L_2 + L_2L_3 + L_3L_1)/L_2; \text{ and}$$

$$L_6 = (L_1L_2 + L_2L_3 + L_3L_1)/L_1. \quad \text{(Equation 1)}$$

The inductance $L_3$ is generally much smaller than the inductances $L_1$ and $L_2$. Accordingly, the inductance $L_5$ is substantially equal to the inductance $L_1$ based on Equation 1. Similarly, the inductance $L_6$ is substantially equal to the inductance $L_2$. The inductance $L_4$ is significantly large.

The circuit shown in FIG. 5 includes the inductance element 27 connected in parallel with the capacitance element 26. This arrangement allows an frequency characteristic of an impedance of the inductance element 27 to be adjusted by the capacitance of the capacitance element 26. As the result, the attenuation at the lower side of the pass band can be controlled without modifying of the series resonators 14, 15, and 16 and the parallel resonators 17 and 18.

Thus, the attenuation at the lower side of the pass band can explicitly be large as denoted by the line A in FIG. 4.

Since the inductance $L_4$ is significantly large, the capacitance of the capacitance element 26 maybe significantly small. This allows the capacitance element 26 to be fabricated by a method similarly to that for fabricating the series resonators 14, 15, and 16 and the parallel resonators 17 and 18. The method will be explained below.

Figure 2:
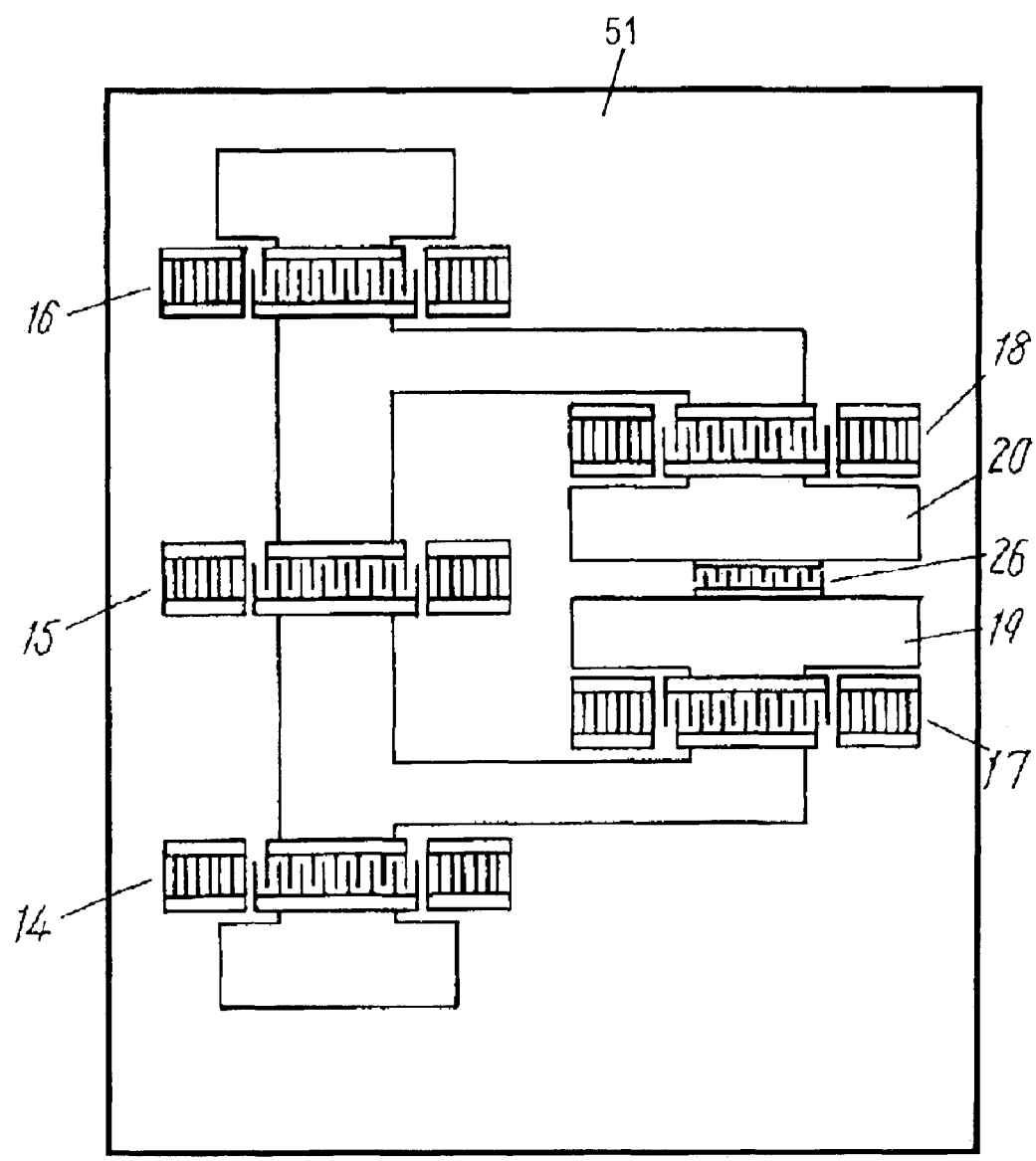
FIG. 2 is a plan view of the SAW filter of the embodiment.

FIG. 2 illustrates the series resonators 14, 15, and 16 and the parallel resonators 17 and 18 in the circuit shown in FIG. 1. The resonators include electrodes formed on a piezoelectric substrate 51. As shown in FIG. 2, the capacitance element 26 is implemented by two inter-digital electrodes 26 extending toward each other from the first and second grounding nodes 19 and 20, respectively, on the piezoelectric substrate 51.

Figure 6:
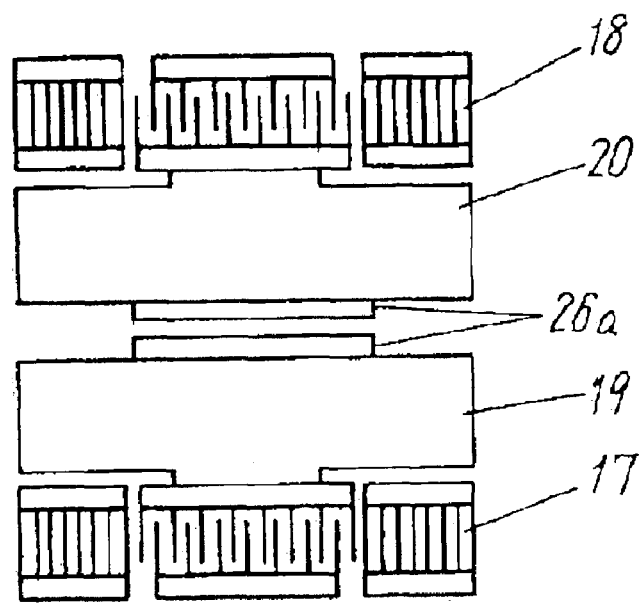
FIG. 6 is a plan view of another SAW filter of the embodiment.
Figure 7:
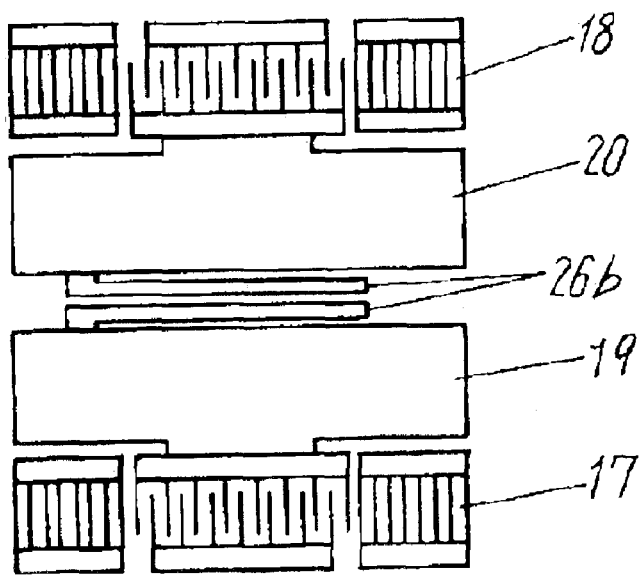
FIG. 7 is a plan view of still another SAW filter of the embodiment.
Figure 8:
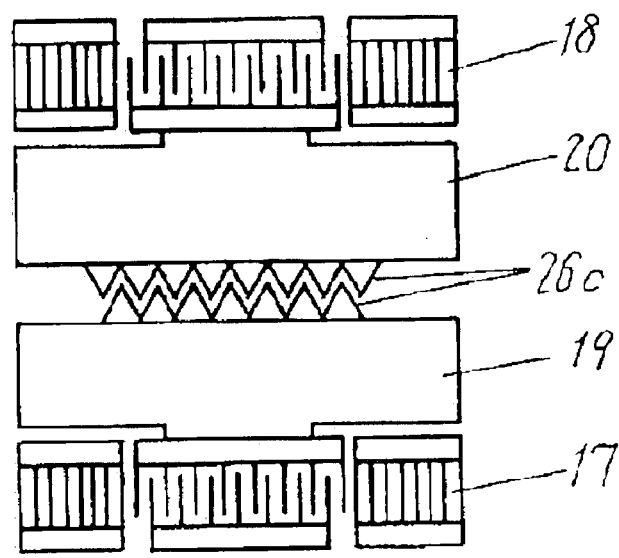
FIG. 8 is a plan view of a further SAW filter of the embodiment.

FIGS. 6, 7, and 8 illustrate other electrodes of the capacitance element 26. The two electrodes of the capacitance element 26 extend towards each other from the grounding nodes 19 and 20, respectively. The electrodes may be electrodes 26a having respective long sides simply projecting as shown in FIG. 6. The electrodes may be L-shaped electrodes 26b extending towards each other to have respective long sides facing each other, as shown in FIG. 7. The electrodes may be electrodes 26c facing each other, as shown in FIG. 8.

The SAW filter according to the embodiment includes three of the series resonators 14 to 16, however may not includes at least one of the series resonators 14 and 16.

Figure 9:
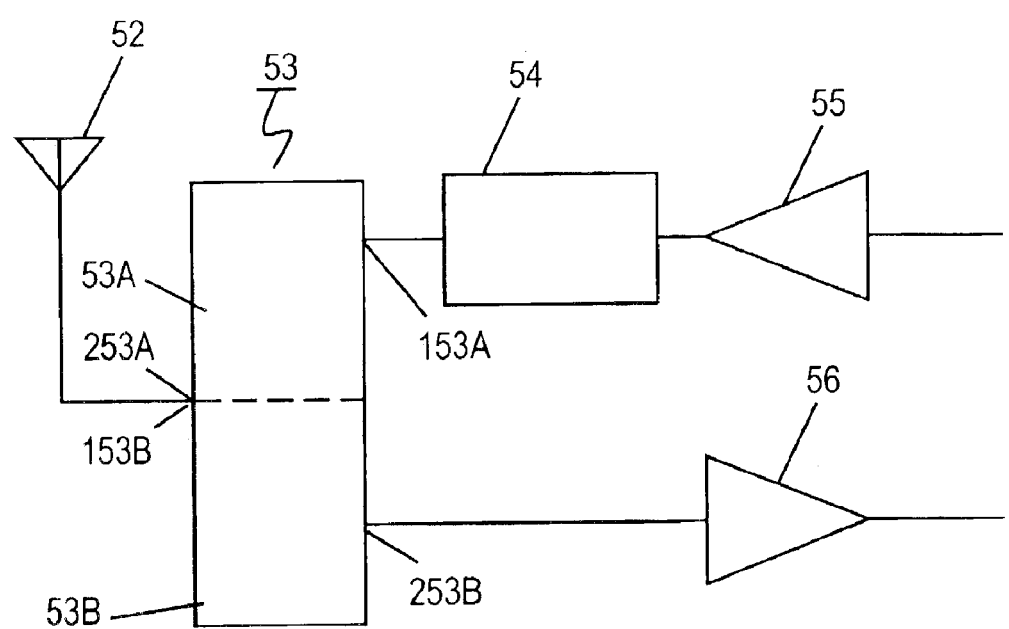
FIG. 9 is a block diagram of an electronic device including the SAW filter of the embodiment.
Figure 10:
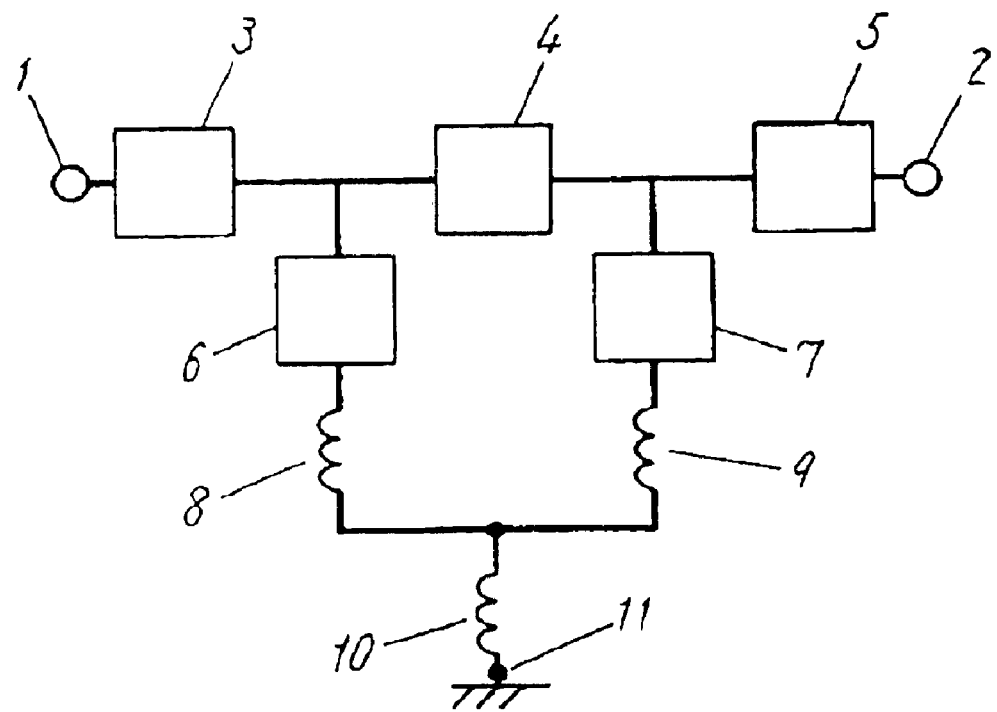
FIG. 10 is a circuit diagram of a conventional SAW filter.

FIG. 9 illustrates an electronic device including the SAW filter of the embodiment and other components. FIG. 9 is a block diagram of a radio-frequency unit of a movable communication apparatus. A SAW duplexer 53 includes SAW filters 53A and 53B having respective pass band different from each other. The radio-frequency unit includes an antenna 52, the SAW duplexer 53 (the SAW filters 53A and 53B), a coupler 54 for connected to input port 153A, 153B, and output port 253A, 253B of the SAW filters 53A, 53B, and electronic components, such as a power amplifier 55 and a low noise amplifier (LNA) 56. The SAW filter 53B connected to the LNA 56 generally has the pass band higher than that of the SAW filter 53A. A signal amplified with an power amplifier 55 is radiated through the antenna 52 efficiently since each SAW filter has a large attenuation at the lower side of the pass band, thus providing the electronic device including the SAW filters 53A and 53B of the embodiment with excellent characteristics.

What is claimed is:

1. A surface acoustic wave (SAW) filter comprising:
   an input terminal;
   an output terminal;
   a series resonator provided between said input terminal and said output terminal;
   first and second parallel resonators having respective one ports connected to respective ports of said series resonator, respectively;
   first and second nodes connected to respective other ports of said first and second parallel resonators, respectively;
   first and second inductance elements having respective one ends connected to said first and second nodes, respectively;
   a third node connected to respective other ends of said first and second inductance elements;
   a third inductance element having one end connected to said third node;
   a grounding terminal connected to other end of said third inductance element; and
   a capacitance element connected between said first and second nodes.

2. The SAW filter according to claim 1, further comprising:
   a piezoelectric substrate for forming at least one of said series resonator, said first parallel resonator, and said second parallel resonators.

3. The SAW filter according to claim 2, further comprising:
   electrodes provided on said piezoelectric substrate and facing each other for forming said capacitance element.

4. The SAW filter according to claim 2, wherein said first and second nodes are formed on said piezoelectric substrate and facing each other for forming said capacitance element.

5. The SAW filter according to claim 2, further comprising:
   projecting electrodes provided on said piezoelectric substrate and extending towards each other from said first and second nodes, respectively, for forming said capacitance element.

6. The SAW filter according to claim 5, wherein said projecting electrodes includes inter-digital electrodes.

7. An electronic device comprising:
   a surface acoustic wave (SAW) filter including
      an input terminal,
      an output terminal,
      a series resonator provided between said input terminal and said output terminal,
      first and second parallel resonators having respective one ports connected to respective ports of said series resonator, respectively.
      first and second nodes connected to respective other ports of said first and second parallel resonators, respectively,
      first and second inductance elements having respective one ends connected to said first and second nodes, respectively,
      a third node connected to respective other ends of said first and second inductance elements, a third inductance element having one end connected to said third node, a grounding terminal connected to other end of said third inductance element, and a capacitance element connected between said first and second nodes; and an electronic component connected to one of said input terminal and said output terminal.

8. The electronic device according to claim 7, wherein said SAW filter further includes a piezoelectric substrate for forming at least one of said series resonator, said first parallel resonator, and said second parallel resonators.

9. The electronic device according to claim 8, wherein said SAW filter further includes electrodes provided on said piezoelectric substrate and facing each other for forming said capacitance element.

10. The electronic device according to claim 8, wherein said first and second nodes are formed on said piezoelectric substrate and facing each other for forming said capacitance element.

11. The electronic device according to claim 8, wherein said SAW filter further includes projecting electrodes provided on said piezoelectric substrate and extending towards each other from said first and second nodes, respectively, for forming said capacitance element.

12. The SAW filter according to claim 11, wherein said projecting electrodes includes inter-digital electrodes.

* * * * *